United States Patent [19]

Smalley et al.

[11] Patent Number: 5,130,064
[45] Date of Patent: Jul. 14, 1992

[54] METHOD OF MAKING A THREE DIMENSIONAL OBJECT BY STEREOLITHOGRAPHY

[75] Inventors: Dennis R. Smalley, Baldwin Park; Charles W. Hull, Santa Clarita, both of Calif.

[73] Assignee: 3D Systems, Inc., Valencia, Calif.

[21] Appl. No.: 429,435

[22] Filed: Oct. 30, 1989

Related U.S. Application Data

[63] Continuation-in-part of Ser. No. 331,644, Mar. 31, 1989, and Ser. No. 339,246, Apr. 17, 1989, Pat. No. 5,104,592, said Ser. No. 331,644, is a continuation-in-part of Ser. No. 269,801, Nov. 8, 1988, abandoned, which is a continuation-in-part of Ser. No. 182,830, Apr. 18, 1988, Pat. No. 5,059,359, said Ser. No. 339,246, is a continuation-in-part of Ser. No. 182,823, Apr. 18, 1988, abandoned.

[51] Int. Cl.⁵ .................. B29C 35/08; B29C 41/02; B29C 41/52
[52] U.S. Cl. .................. 264/22; 156/64; 156/273.5; 156/275.5; 156/307.1; 250/492.1; 264/40.1; 264/308; 364/476; 365/106; 365/107; 427/8; 427/53.1; 427/54.1
[58] Field of Search .............. 264/22, 40.1, 236, 255, 264/298, 308, 347; 156/64, 273.3, 273.5, 275.5, 307.1; 427/8, 53.1, 54.1; 364/468, 474.05, 474.24, 476, 521, 522, 523; 365/107, 119, 120, 127, 106; 250/492.1

[56] References Cited

U.S. PATENT DOCUMENTS

| | | | |
|---|---|---|---|
| 2,775,758 | 12/1956 | Munz | 156/58 X |
| 4,575,330 | 3/1986 | Hull | 264/22 X |
| 4,752,498 | 6/1988 | Fudim | 427/54.1 |
| 4,863,538 | 9/1989 | Deckard | 156/62.2 |

FOREIGN PATENT DOCUMENTS

| | | |
|---|---|---|
| 250121 | 6/1987 | European Pat. Off. . |
| 322257 | 12/1988 | European Pat. Off. . |
| 388129 | 3/1990 | European Pat. Off. . |
| 63145015 | 6/1984 | Japan .................. 425/174.4 |
| 61-225012 | 10/1986 | Japan .................. 264/22 |

OTHER PUBLICATIONS

Requicha, A. A. G. et al. "Solid Modeling: A Historical Summary and Contemporary Assessment", *Institute of Electrical and Electronics Engineers Computer Graphics and Applications* (Mar. 1982), pp. 9–24.

Herbert, A. J. "Solid Object Generation", *Journal of Applied Photographic Engineering*, vol. 8, No. 4 (Aug. 1982), pp. 185–188.

Fudim, E. V. "Sculpting Parts With Light", *Machine Design* (Mar. 6, 1986), pp. 102–106.

Fudim, E. V. "A New Method of Three-Dimensional Micromachining", *Mechanical Engineering* (Sep. 1985), pp. 54–59.

Kodama, Rev. Sci. Instrum. 52(11), Nov. 1981, "Automatic Method For Fabricating A Three Dimensional Plastic Model With Photo-Hardening Polymer", pp. 1770–1773.

Herbert, A. J., Journal of Imaging Technology, vol. 15, Number 4, August 1989 "A Review of 3D Solid Object Generation", pp. 186–190.

*Primary Examiner*—Leo B. Tentoni
*Attorney, Agent, or Firm*—Lyon & Lyon

[57] ABSTRACT

A stereolithographic method for constructing an object from a medium capable of solidification upon exposure to synergistic stimulation (e.g. a laser beam). Stacked layers of solidified medium are constructed by exposing the medium to synergistic stimulation in magnitude and pre-selected pattern, such that each layer is formed with external boundaries and up and down facing surfaces as necessary. At least a portion of a layer which is neither upfacing nor downfacing is also skinned, e.g., provided with a continuous skin formed by overlapping skin vectors or traces of the laser beam. Alternatively, all intermediate or internal cross-sectional layers are provided with skin and cross-hatch. Upfacing and downfacing features, and intermediate layers may be provided with a skin created by scanning in a first pass using non-consecutive skin vectors followed by scanning in at least one additional pass that completes the exposing process by filling in between the originally drawn vectors. To reduce waffling, regions of intersecting vectors at least in down-facing surfaces are determined. Exposure of one or more of the respective intersecting vectors is reduced at the regions of intersection to provide downfacing features with a uniform exposure.

54 Claims, 4 Drawing Sheets

SQUARE PATCH 5

SQUARE PATCH 6

SQUARE PATCH 7

SQUARE PATCH 8

METHOD OF MAKING A THREE DIMENSIONAL OBJECT BY STEREOLITHOGRAPHY

REFERENCE TO RELATED PARENT APPLICATIONS

This application is a continuation-in-part of U.S. patent application Ser. No. 07/331,644, filed Mar. 31, 1989, which is in turn a continuation-in-part of U.S. patent application Ser. No. 07/269,801 filed Nov. 8, 1988, now abandoned, which is in turn a continuation-in-part of U.S. patent application Ser. No. 07/182,830, filed Apr. 18, 1988, (U.S. Pat. No. 5,054,359); this application is also a continuation-in-part of U.S. patent application Ser. No. 07/339,246, filed Apr. 17, 1989, (U.S. Pat. No. 5,104,592) which is a continuation-in-part of U.S. patent application Ser. No. 07/182,823, filed Apr. 18, 1988, now abandoned.

BACKGROUND OF THE INVENTION

Field of the Invention

This invention relates to the field of stereolithography, which is a technique for making solid, three-dimensional objects (or "parts") from solidifiable fluid or fluid-like materials.

In recent years, stereolithography systems, such as those described in U.S. Pat. No. 4,575,330, issued Mar. 11, 1986 and entitled "Apparatus for Production of Three-Dimensional Objects by Stereolithography," have come into use. Basically, stereolithography is a method for automatically building complex three-dimensional parts by successively solidifying thin cross-sectional layers of photopolymer ("resin") or the like (such as powdered materials, which are converted from a fluid-like medium to a cohesive cross-section by melting and solidification) on top of each other until all of the thin layers are joined together to form a whole part. Photocurable polymers change from liquid to solid in the presence of simulating radiation and their photospeed with ultraviolet light (UV) is fast enough to make them practical model building materials. A radiation source (e.g., an ultraviolet laser) generates a beam which is focused to a small intense spot, which is moved across the liquid photopolymer surface by a galvanometer or servo type mirror x-y scanners. The scanners are driven by computer generated vectors or the like. The material that is not polymerized when a part is made is still usable and remains in the vat as successive parts are made. With this technology, the parts are literally grown from a vat of fluid material (e.g. liquid plastic), and precise complex patterns can be rapidly produced. This method of fabrication is extremely powerful for quickly reducing design ideas to physical form for making prototypes.

This technology typically requires a stereolithography apparatus, referred to as an "SLA," which generally includes a laser scanner, a photopolymer vat, an elevator, and a controlling computer. The SLA is programmed to automatically make a three-dimensional part by drawing it as a sequence of built-up cross-sectional layers.

Stereolithography represents an unprecedented way to quickly make complex or simple parts without tooling. Since this technology depends on using a computer to generate its cross sectional patterns, there is a natural data link to computer aided design and manufacture (CAD/CAM). However, such systems have presented challenges relating to structural stress, shrinkage, curl and other distortions, as well as resolution, speed, accuracy and difficulties in producing certain object shapes.

RELATED PATENTS AND APPLICATIONS

The following patents and applications are all assigned to the assignee of this invention and are all incorporated by reference into this disclosure as though fully set forth herein. U.S. Patent Application Serial No. 07/331,664, describes in great detail the presently preferred stereolithographic apparatus, as well as various methods to form parts therewith. This parent application is incorporated herein by reference, including its appendices, as though fully set forth herein to facilitate handling due to the relatively lengthy disclosure of the parent.

U.S. Pat. No. 4,575,330 discusses stereolithography in general. It teaches uniform polymerization of each cross-section in the formation of a stereolithographically-formed object.

U.S. patent application Ser. No. 07/415,134, filed Sep. 29, 1989, now abandoned, describes post-curing based on the traditional approach to building stereolithography parts.

U.S. patent application Ser. No. 07/339,246 described several methods of reducing curl distortion.

U.S. patent application Ser. No. 4,999,143 describes the use of web supports to support and minimize curl in a part being formed.

U.S. Pat. No. 5,015,424 describes the use of Smalleys to minimize curl.

U.S. patent application Ser. No. 07/429,911 describes the use of multiple penetration depths in the stereolithographic process, along with the use of beam profile characteristics in combination with resin parameters, to predict various cure parameters associated with the creation of stereolithographic parts; and also discusses the role of beam profile information in the creation of skin fill.

U.S. patent application Ser. No. 07/429,301, now abandoned, discussed new post-processing techniques.

BACKGROUND INFORMATION

In the normal practice of stereolithography, objects or "parts" are built on a layer-by-layer basis, where each layer represents a thin cross section of the part to be formed. Initial approaches to stereolithographic part building were based on the complete filling (i.e., polymerization) of layers. This filling was either done by the scanning of a pencil of light or by flood exposure of an appropriate cross-sectional image. The pencil of light approach strictly used complete filling of cross-sections based on the scanning of adjacent overlapping vectors until the entire cross-sectional pattern was cured. These initial approaches suffered from several drawbacks, including distortion, curl, inaccurate sizing, lack of structural integrity, and lack of uniformity in down-facing surface appearance.

Later stereolithographic techniques used an internal lattice of partially cured polymer ("cross-hatch" or "hatch") in place of completely filling the successive layers. The internal structures primarily consisted of cross-hatch separated by liquid (uncured) photopolymer. The outer and inner edges of each layer were solidified by scanning of what are called "boundary vectors" (also termed, "boundaries" or "border vectors" or "borders"). These vectors separate the interior of a part from exterior liquid. Layers or portions of layers that bounded external regions of the part were completely filled (with fill, termed "skin fill" or "skin") after being cross-hatched. The hatch insured adequate support for the fill or "skin" as it was being created, thereby minimizing distortion.

The skin, crosshatch, and borders trap liquid photopolymer internally in the part structure and hold it in place while the part is being created. The liquid photopolymer and partially cured polymer (which together make up the boundaries, hatch, and skin) are brought to full polymerization in a later process known as "post curing". This approach to part building, while highly effective, is susceptible to some improvements.

Fairly extensive post-curing can be required when the internal cross-hatch lattice only defines x-z and y-z planes, as in such cases long corridors of unpolymerized material remain substantially uncured until post-processing. A method of reducing or eliminating post-processing time and associated distortions while increasing structural integrity of the stereolithographically formed part would be highly desirable.

Moreover, such stereolithographic building techniques have upon occasion resulted in down-facing features having a wafflish appearance and texture. This appearance and texture are due to inappropriate curing techniques being used on regions of layers that contain down-facing features. When down-facing features are given both hatch and skin fill, there can be overexposure of the regions where the hatch and skin fill coincide. Similarly, overexposure can occur at the points of intersection of cross-hatch vectors. In the past, it has been possible to ignore the requirement of uniform cure depth for down-facing features, since other accuracy-related errors shadowed this effect. However, as the stereolithography art strives for and attains increasingly higher levels of accuracy, imperfections such as these can no longer be overlooked. It would be desirable to correct these imperfections in combination with improved building techniques.

It would be useful in the practice of stereolithography to obtain accurate skin thicknesses without the need of periodically building test parts and without the need of being concerned with energy distribution in the beam (beam profile). Traditionally, the methods used to estimate skin depth were only guesses that had a remote connection to actual experimental data. The actual skin thicknesses obtained by these traditional approaches were strongly dependent upon beam profile characteristics, skin vector spacing, drawing speed, and resin characteristics. However, these parameters were not coordinated to yield a particular skin thickness. For example, skin thicknesses hoped to be 20 mils could easily range from 15 to 25 mils. In the past, this type of thickness range has been tolerated, but as the art of stereolithography advances, there is an increasing need for more accurate and less cumbersome methods of predicting the required exposure to obtain a desired skin thickness.

SUMMARY OF THE INVENTION

According to a first aspect of the invention, an improvement is disclosed in a stereolithographic method comprising the steps of constructing stacked layers to form an object having external boundaries, internal cross hatch, and skinned up- and down-facing features. The improvement comprises providing skin fill in less than all of the stacked layers, but in more than the up- and down-facing features of the object.

According to another aspect of the invention, an improved stereolithographic method is disclosed comprising the step of providing all cross-sectional layers with skin fill and cross hatch.

According to yet another aspect of the invention, an improved stereolithographic method is disclosed comprising the step of providing at least up- and down-facing features with skin fill that is created by scanning in a first pass using nonconsecutive fill vectors, followed by scanning in at least one additional pass that completes the exposing process by filling in between the originally drawn vectors.

According to yet another aspect of the invention, an improved stereolithographic method is disclosed comprising the steps of determining regions of intersecting vectors at least in down-facing surfaces, and reducing exposure of one or more of the respective intersecting vectors at these regions of their intersection, such that the down-facing features have a uniform exposure.

According to yet another aspect of the invention, an improved stereolithographic method is disclosed comprising the creation of a region that contains a combination of hatch and fill vectors and is cured to a uniform depth. The creation of this region comprises the steps of creating the desired hatch vectors, and then creating corresponding skin fill types that do not contribute to the re-exposure of the regions of their corresponding hatch vectors.

According to yet another aspect of the invention, an improved stereolithographic method is disclosed comprising a method of determining necessary exposure and vector spacing and scanning parameters in order to obtain a known thickness of skin fill.

According to still another aspect of the invention, an improvement is disclosed in the stereolithographic method comprising the steps of constructing stacked layers to form an object having external boundaries, internal cross hatch, and skinned up- and down-facing features. The improvement comprises the steps of: (a) selecting layers to be provided with skinned surfaces; (b) providing means for calculating the amount of total exposure required to obtain skin curing of a preselected depth at said layers selected to have skinned surfaces; (c) providing means for determining the number of vectors that will be exposing each region in said layers, and (d) providing means for partially polymerizing said layers by exposing them first to boundary vectors, then to hatch vectors, and then to skin vectors, each vector providing an exposure sufficient to cure to the preselected depth calculated in step (b), divided by the number of vectors that will intersect the vector at a given region as determined in step (c).

According to other aspects of the invention, these improvements are used in combination with one another and/or in combination with curl reduction techniques as described in: U.S. patent application Ser. No. 07/339,246; U.S. Pat. No. 5,015,424; and U.S. Pat. No. 4,999,143, all of which are fully incorporated herein by reference. For example, according to yet another aspect of the invention, an improved stereolithographic method is disclosed comprising the combined use of hatch with nonconsecutive skin fill in more than the up- and down- facing features. As another example, an improved stereolithographic method is disclosed comprising the method of reducing exposure where vectors intersect and providing discontinuities in skin fill to avoid multiple vector exposure in regions where hatch vectors have been provided.

Other aspects of the invention, together with objects and attendant advantages of the various embodiments, will best be understood from an examination of the drawings along with a study of the detailed description below.

DETAILED DESCRIPTION OF THE PREFERRED EMBODIMENTS

The instant invention addresses alone or in combination three improvements in stereolithographic methods. These are, first, methods of increasing structural integrity while reducing the need for post-curing; second, methods of obtaining uniform exposure to regions of intersecting vectors of different types; and third, methods of determining cure depth. Although these three aspects of the invention are closely inter-related and are often cross-dependent, they will be addressed in sequence in this detailed description, and will also be illustrated in the Examples below.

DEFINITIONS

"Beam profiles" represent the energy distribution of irradiation in a beam of ultraviolet light or the like, used to cure photopolymer or other curable material in accordance with stereolithography practices.

"Effective Cure Width" (ECW) is a distance equal to twice the closest possible spacing of two vectors from one another that will render a given individual cure depth (i.e., a cure depth associated with each vector) without increasing the cure depth of the combination. For the preferred beam profiles and cures, the Effective Cure Width (ECW) is always less than the Maximum Cure Width (MCW), such that different lines of solidified material can be adhered without an increase in cure depth. For example, in FIG. 5b, the horizontal separation between lines 118 and 120 might represent the ECW for string 100. Typically, one half the ECW represents the closest point that a similar line of material can approach 100 without increasing its maximum cure depth. More generally, the ECW is a zone that surrounds the center line of a string, such as string 100, that represents the closest position that another arbitrary (of thickness and direction) string of solidified material or set of strings of material can approach the first string without resulting in the maximum cure thickness of the combination being greater than the maximum thickness of either string.

"Layers" are the incremental thicknesses of polymer exposed to the ultraviolet light (or other polymerizing source), which are constructed to adhere to one another and collectively form the polymerized or partially polymerized stereolithographically-produced part.

Figure 5A:
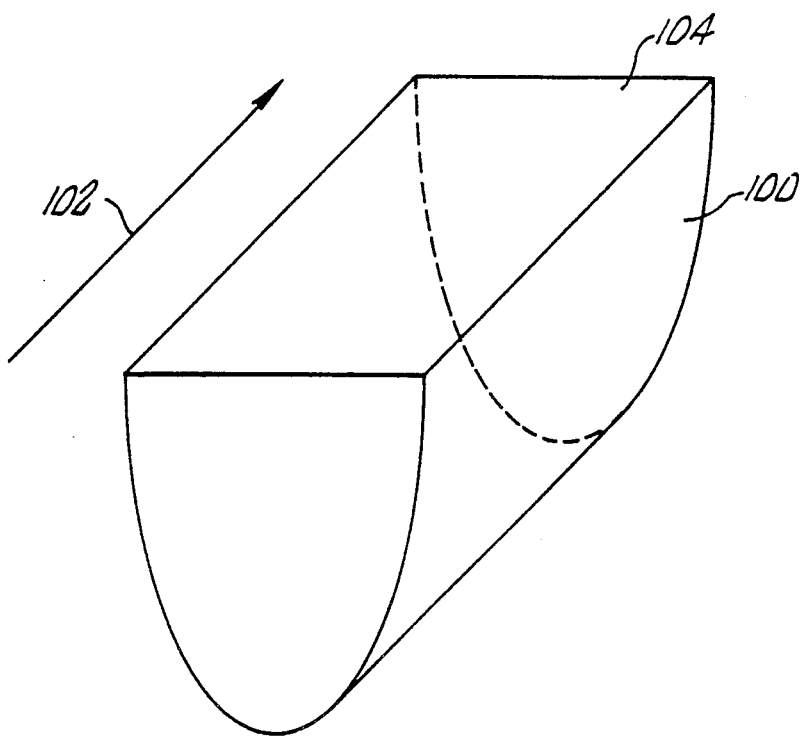
FIG. 5 collectively shows the profiles of a cured "string," corresponding to the cure produced by a single vector.
Figure 5B:
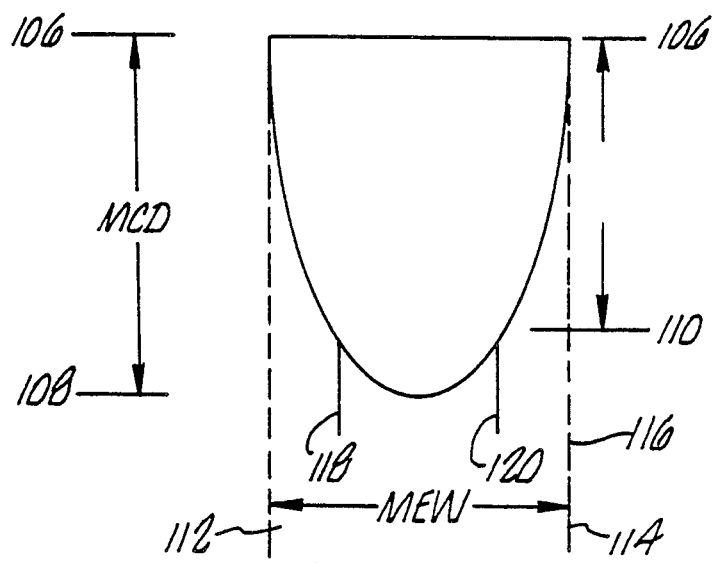

"Maximum Cure Depth (MCD)" and "Maximum Cure Width (MCW)" refer, respectively, to the deepest and widest cure that is obtained when exposing a single line uncured polymer to radiation. The maximum cure depth is generally what is referred to as the cure depth of boundary and hatch lines. Since the beam of light is not generally of constant intensity across its width, the cure depth and width caused by this beam tracing across the same line one or more times does not produce a uniform depth and width of cure. The maximum depth of cure generally occurs near the middle of a cross section of the trace but it can actually occur anywhere depending on the distribution of intensity in the beam. The maximum width of cure occurs at the top (surface) of the cure line of material. An example of the maximum depth and width of cure are depicted in FIG. 5. FIG. 5a shows a line (sometimes called a string) of cure material 100. Vector 102 indicates the scanning direction used in creating the string of material 100. Surface 104 represents the solidified material that was created from the liquid material that formed part of the surface of the curable liquid. FIG. 5b represents an end-on view of string 100. Line 106 indicates the position of the top of the cured string 100, while line 108 represents the bottom of cured line string. The vertical distance between 106 and 108 is the maximum cure depth of string 100. Line 112 represents the left-most edge of string 100, while line 114 represents the right-most edge of string 100. The horizontal separation between 112 and 114 is the maximum cure width of string 100. Such a string 100 of plastic may be used for several purposes: 1) to insure adhesion between the layer of its creation and the preceding layer, 2) to form a down-facing feature of a part being created and 3) as an element of a series of such strings of cured material, where the series will be used for one of the above two purposes. An up-facing feature is not included in the above since it can be fit into one of the above categories depending on the situation. For the first purpose listed above, maximum cure depth would preferably be greater than the layer thickness. The vertical separation between line 106 and line 110 represents the layer thickness in such a case. For the second purpose the MCD represents the layer thickness, and for the third purpose the vertical separation between line 106 and line 116 might represent the layer thickness.

"Overlapping" refers to two or more exposures being given to a region so that an increase in maximum cure depth occurs. Since cure profiles are not necessarily step functions, two separately exposed areas can touch and bind to one another without changing the maximum cure depth of either. When two lines are exposed beside one another their maximum widths may overlap resulting in a larger exposure in this region, and a corresponding increase in depth. But if this additional exposure does not occur in the region near the maximum cure depth of the individual lines, their combined maximum cure depth will not generally be any deeper than their individual maxima.

"Step Period" (SP) is a part-building parameter that defines the period between each laser step.

"Step Size" (SS) is a part-building parameter that defines the size of the step moved by the laser spot on the resin surface.

"Vectors" are data that represent the direction and length of irradiation exposure in the process of solidifying liquid polymer, or other fluid-like, solidifiable mediums.

"Skin" vectors are horizontal surface vectors that are typically traced from one boundary to an opposing boundary and back at relatively high speed and with a substantial overlap, and typically form "skin fill" which defines at least the upper and lower horizontal exterior surfaces of the stereolithographically-formed part. Typically, skin vector spacing is from about 1 to about 4 mils apart for a maximum cure width of about 14 to 15 mils. Such an overlap would typically yield a 20 mil, uniform cure depth. Of course, these exemplary and illustrative parameters can be varied as needed based upon such considerations as the desired smoothness of the layers, the power of the laser, the possible speed range of the irradiating source (i.e., the maximum drawing speed), the layer thickness desired, and the number of vectors that are desired to be stored. According to certain aspects of this invention, however, skin fill is provided in more than the exterior surfaces of the part. According to other aspects of the invention, skin vectors can be drawn non-consecutively, e.g., a first pass at 7-8 mil intervals and a subsequent pass at intervening intervals. These aspects and others will be described in detail below.

"Boundary" vectors are traced to define the vertical exterior surfaces of the stereolithographically-formed part. These vectors generally are scanned more slowly than skin vectors, such that a greater cure depth is obtained. Boundaries, unlike skin fill, generally do not rely on overlapping-but-offset passes to attain their full cure depth. In situations where regions on a given layer overlap regions of the previously formed layer (in other words non-down-facing regions), it is preferred that the cure depth exceed the layer thickness, so that improved adhesion between layers results. In regions of down facing features, it is preferred that net cure depth be equal to the layer thickness.

"Hatch" vectors are similar to boundary vectors, except that they are traced in a substantially uniform, criss-cross type pattern, to define the internal lattice structure of the stereolithographically-formed part. Again, it is preferred that the cure depth exceed the layer thickness, if being drawn in a non-down-facing region, so that improved adhesion between layers results. If being drawn in a down-facing region, then layer thickness cure depth is preferred. Hatch vectors may also have non criss-cross patterns. For example, hatch vectors may be a set of non-crossing lines applied to define internal structure.

Other definitions can be obtained as needed from the manuals attached hereto as Appendices B and C, which have been incorporated herein by reference. Moreover, the specifications of the SLA hardware, the resin and laser types, and the generally preferred parameters with respect to the stereolithographic processes described and improved upon herein are set forth in said Appendices.

Preferred Methods of Obtaining Improved Structural Integrity

Several preferred embodiments of this invention relate to methods of obtaining improved structural integrity, lower post cure distortion, and lower overall horizontal distortion, by providing skin on more than just the up- and down-facing surfaces of the part being formed. For example, the effect of providing skin at only the up- and down-facing surfaces, and supplying cross hatch in x-z and y-z planes, is to create an internal structure consisting essentially of relatively long columns of unpolymerized material trapped by the partially polymerized cross hatch and boundary material on the sides and skin on the up- and down-facing surfaces. Accordingly, a leak in any portion of the down-facing or up-facing skin or cross hatch would have the potential to cause distortion and unwanted drainage. However, if skin is provided in the x-y plane, at more than the up- and down-facing surfaces, then the compartments of unpoylmerized material trapped by crosshatch, boundary and skin would be much smaller and better-contained. Other advantages emanating from providing additional skinned surfaces within the internal structure of the part can include improved structural integrity, less distortion, and reduced post-curing times. Surface finishing can be performed before post-curing, and in some circumstances, post curing can be completely avoided.

Several new skinning techniques can advantageously be used in connection with this invention, based on non-consecutive ordering of skin vectors. Traditionally, skin vectors are ordered head-to-tail, such that a first vector pass is made from one boundary to an opposing boundary, and a second is then made, slightly offset (e.g., typically from 1 to 4 mils from the first), from the latter boundary back to the first. However, it has been found, in accordance with preferred embodiments of this invention, that distortion can be reduced by appropriate, non-consecutive ordering of skin vectors. Specifically, the offset between vectors can be advantageously increased (e.g., doubled), such that the successive skin vectors have less impact, or do not impact, upon adjacent lines of curing polymer for a given series of passes across the surface of the part being formed. In one or more successive series of passes, additional skin vectors can be drawn "in between" those that had been drawn in earlier series of passes.

Yet another embodiment according to which distortion can be minimized involves skinning in different directions for different layers. For example, in a part having x- and y- hatch, odd layers can be skinned in the x-direction and even layers in the y-direction, or vice versa.

In still another embodiment, skin fill can be provided in both x- and y- directions in a given layer having x- and y-cross-hatch.

According to a most preferred embodiment, however, x, 60° and 120° cross-hatch is provided with skin fill in at least one of the x, 60° and 120° directions, and preferably, in each of said directions. In a preferred variation of this embodiment, discussed in more detail below, the skin vectors of a given direction are not traced directly over the hatch vectors of the same direction, to avoid multiple exposure. Moreover, since exposure is provided in three directions over any given point in a skinned layer, the vector scanning speed can be increased by a factor of three to yield one-third of a normal exposure per vector, resulting in a uniform normal exposure after all three directional passes are made.

Preferred Methods of Obtaining Uniform Exposure

Turning to FIGS. 1 and 2, it will be seen that multiple exposure of boundaries 10, hatch lines 12, and skin fill 14 will likely cause cure depth variations as depicted in FIG. 2.

To obtain a smooth down-facing region, the net exposure over all the area elements must be the same. While uniform cure depth is necessary for smooth down-facing features, it is not necessary to achieve smooth up-facing features. These up-facing features attain their smooth surface finish from the smoothness of the working surface (resin surface), and from adequate strength of skins preventing their collapse from various forces including shrinkage during post-curing.

There are three main approaches that are exemplified herein to attain uniform exposure, particularly of down-facing regions. While the third approach is most preferred, the other two are within the scope of the invention, as are variations of all three that will be apparent to one of ordinary skill in the art in light of the following description.

A first approach to avoid differential exposure is to avoid the use of both boundary and hatch vectors, and only use fill vectors to cure down-facing regions, using uniformly exposed skin fill that results in an appropriate skin depth. This is a viable method of obtaining uniform exposure and therefore cure depth, but can suffer from distortion problems, as a relatively rigid frame (boundary and cross-hatch) is generally required to keep the skin from distorting as it is drawn.

A second approach is to draw boundary and modified hatch vectors to the full desired depth. First, hatch vectors must not be permitted to cross other hatch or boundary vectors to avoid extra depth being added to these solidified crossover regions. The remaining pockets are filled in with small skin fill vectors that do not cross any of the cured boundary or hatch lines.

This second approach can be implemented, for example, by either of two methods.

The first method is based on a single direction of hatch being drawn as uninterrupted vectors with hatch that runs in other directions "jumping" the points where they cross the first hatch type and where they cross each other. These hatch vectors are broken into their required components and stored in an output file for controlling the movement of the scanning mirrors (sometimes referred to as an SLI file). In addition to hatch vectors that are drawn part of the time and jump the other part of the time, individual skin fill vectors can be created to fill each pocket that is formed by intersecting hatch and/or boundary vectors. These fill vectors are stored in the SLI file.

The second method is based on standard hatch and skin fill vectors being stored in the SLI file along with a system (e.g., as part of the mirror driving system) that uses slice, beam profile, and cure depth parameters to break down vectors into drawing and jumping elements depending on whether they cross a hatch vector, boundary vector, or whether a hatch vector is underneath the vectors being analyzed.

These two methods falling within the second approach require definition of what it means for hatch and skin fill vectors to cross or lay on top of hatch or boundary vectors. This definition can be based on a determination of how closely an exposed vector (both skin and hatch) can approach a hatch or boundary vector without causing an increase in maximum cure depth in that region.

The first method of this second approach may result in creating large SLI files and large associated vector loading times. Accordingly, the second method of the second approach is currently more preferred, when used in conjunction with a look-up table. The contents of such a table in each instance will vary, depending upon the slice parameters used, beam profile characteristics, and desired cure depth to be obtained, and can be routinely formulated for any required set of parameters by one of ordinary skill in the art. This system can optionally be adapted to account for approach angles between vectors.

Figure 1A:
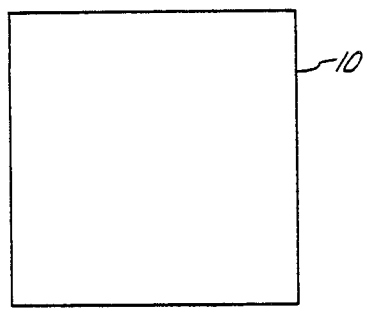
FIG. 1 collectively shows a top view of a layer showing boundaries, hatch and skin without compensation for multiple exposure of resin. Sub-diagrams a, b, c and d represent, respectively: a) boundaries only; b) crosshatch only; c) skin only; and d) combined vectors.
Figure 1B:
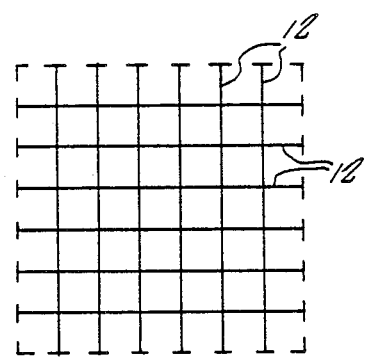
Figure 1C:
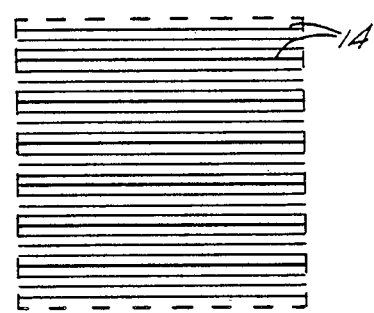
Figure 1D:
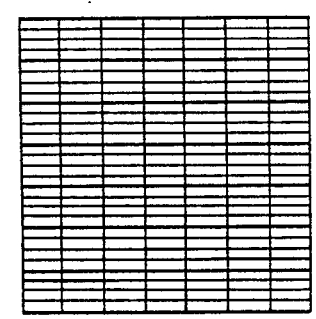
Figure 2A:
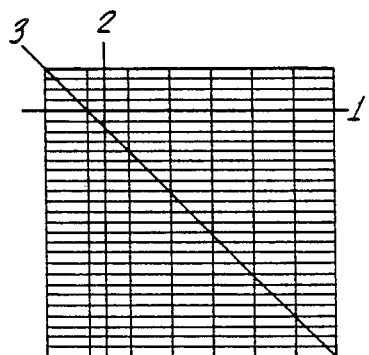
FIG. 2 collectively shows a side view of FIG. 1d as intersected by various vertical planes. Sub-diagrams a, b, c and d represent, respectively: a) repeat of FIG. 1d with slicing planes; b) a view of the edge of the layer along plane 1 showing the various depths obtained in different regions; c) a view of the edge of the layer along plane 2 showing the various depths obtained in different regions; and d) a view of the edge of the layer along plane 3 showing the various depths obtained in different regions.
Figure 2B:
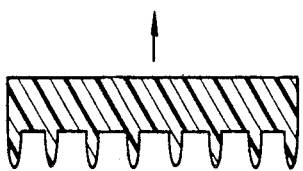
Figure 2C:
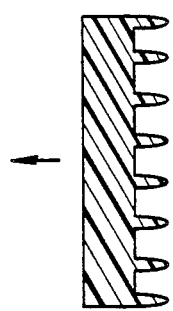
Figure 2D:
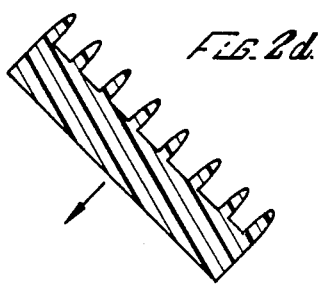
Figure 3A:
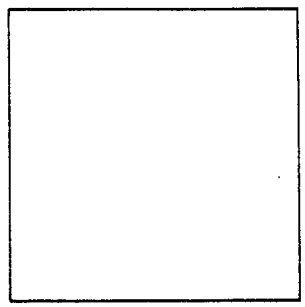
FIG. 3 collectively shows a top view of a layer showing boundaries, hatch and skin as created by a presently preferred technique. Sub-diagrams a, b, c, d and e represent, respectively: a) boundaries only; b) crosshatch only; c) skin type 1; d) skin type 2; and e) combined vectors.
Figure 3B:
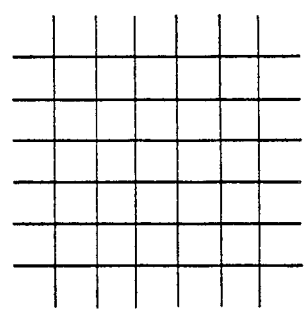
Figure 3C:
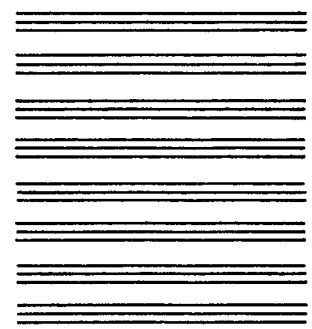
Figure 3D:
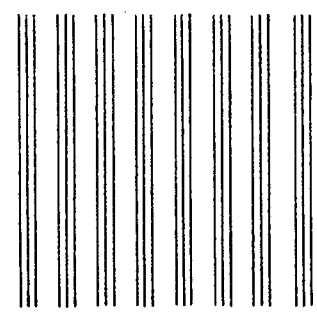
Figure 3E:
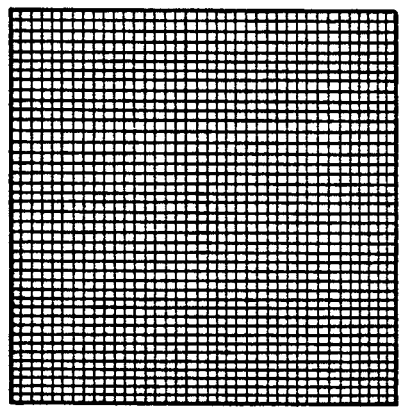
Figure 4A:
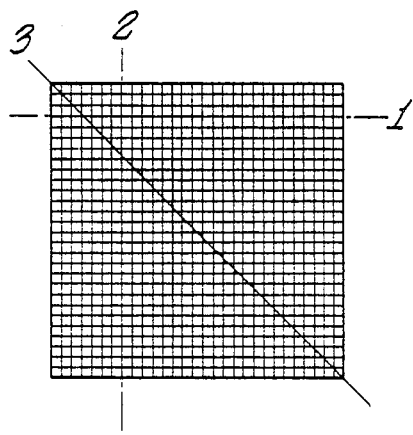
FIG. 4 collectively shows a side view of FIG. 3e as sliced along three different vertical planes. Sub-diagrams a, b, c and d represent, respectively: a) repeat of FIG. 3e with slicing planes; b) a view of the edge of the layer along plane 1 showing the various depths obtained in different regions; c) a view of the edge of the layer along plane 2 showing the various depths obtained in different regions; and d) a view of the edge of the layer along plane 3 showing the various depths obtained in different regions.
Figure 4B:
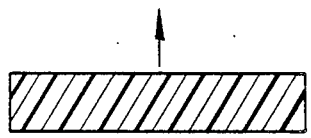
Figure 4C:
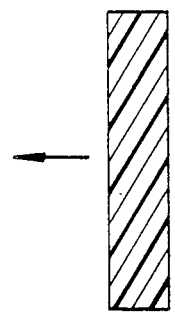
Figure 4D:
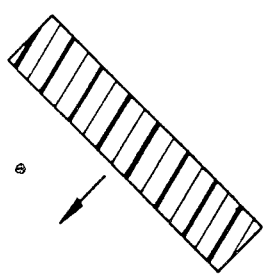

The third, and currently most preferred, approach is based upon matching skinning parameters to hatch parameters, to avoid duplicate exposure by skin vectors of regions cured by hatch vectors. The duplicate exposure could result from skin vectors running parallel or anti-parallel to the hatch vector regions. This approach differs from the above-described approaches in that the skin vectors are drawn over the cross-hatch, giving additional exposure to hatch vectors that are not parallel to the skin vectors as drawn. This continuation of skin fill vectors will keep the SLI file size from becoming too long. This approach is collectively illustrated in FIG. 3. It will be noted that the skin fill in FIGS. 3c and 3d is discontinuous in areas corresponding to the x- and y- hatch running parallel thereto. The uniformity of the resulting cure depth is illustrated in FIG. 4.

A down-facing skin area, or "region," can be divided into categories or "subregions," based upon the nature of the exposure, i.e., whether and to what extent there is overlap between different vector exposures, as follows:
  subregion 1—skin exposure only;
  subregion 2—skin and hatch overlapping exposure;
  subregion 3—skin and boundary overlapping exposure;
  subregion 4—hatch and boundary overlapping exposure; and
  subregion 5—skin, hatch and boundary overlapping exposure.

Several approaches are suitable for exposing subregions 1 through 5 such that each region will be given the same exposure. In the presently most preferred embodiments, three criteria are paramount.

First, to provide a suitably rigid frame to support the skin fill, the following drawing order is preferred: first, boundary vectors, then hatch vectors, and finally fill vectors are drawn.

Second, the fill vectors and the hatch vectors preferably begin and end short of the boundary vectors by ½ the ECW of the boundary vectors. This reduces subregions 3, 4, and 5 to regions that contain boundary vectors only, such that the boundary vectors should be given the full exposure required in order to attain the desired cure depth.

Finally, a set of fill vectors are preferably drawn parallel to each type of hatch vector used, and all fill vector types are preferably given the same exposure, with the exception that fill vectors should not be allowed to contribute to further exposure in the regions exposed by their parallel hatch type. For example, if x- and y- hatch are used, then x- and y- fill are also used. Also x- fill vectors will only be created that are spaced at least ½ the ECW of the hatch lines from the x- hatch vectors. A similar relationship should be maintained for y- fill and y- hatch. This means that subregion 1 will have an exposure equivalent to the combined exposure of each fill type. Using the same example of x- and y- hatch and fill, each fill type should be exposed to ½ the exposure required to obtain the desired cure depth. Limiting fill vector exposure in this manner has a profound effect on subregion 2, which can be considered to consist of two microregions: a) a microregion containing overlapping of the various hatch types as well as the various fill types, and b) a microregion containing a single hatch type and the various fill types. Fill vectors will be absent from this first microregion since they have been excluded to avoid reexposing hatched areas. Therefore, the first microregion receives its total exposure from that of the combined hatch types. Thus, for x- and y- hatch, each hatch type will contribute ½ the needed exposure. For the second microregion, part of the exposure will be provided by the single hatch line, and the remainder by fill types that are nonparallel to it. This results in the total exposure being given by the exposure of one hatch line plus the exposure from all but one of the skin types. Therefore, the number of exposure sources is equal to the number of cross hatch types, and hence, to the number of skin fill types. Using x- and y- hatch, for example, ½ the exposure in a region of x- hatch is provided by this hatch and the other ½ is provided from the y- fill.

This most preferred approach can be summarized as follows: The preferred curing order begins with boundary vectors, followed by hatch vectors, and finally by fill vectors. The boundary vectors provide the desired cure depth. The skin and hatch vectors are shortened by the ECW of the boundaries (½ on each end). The fill vectors are not allowed to contribute to the exposure (be created) within ½ the ECW of either side of a parallel hatch vector. Each combination of hatch type with its parallel skin type is used to achieve a uniform cure depth. Each hatch and fill type is given the same exposure; therefore, the individual fractional exposure (IFE) given to each type is the reciprocal of the number of different hatch types (NHT), i.e., $IFE = 1/NHT$.

Another preferred embodiment is based on the use of the presently preferred cross hatching method. The preferred hatching technique utilizes x and 60/120 hatch instead of x- and y- hatch. While the foregoing discussion relates to general preferred methods of reducing waffle appearance, it is most preferred to use this method of waffle reduction/removal in connection with these presently preferred hatch types, i.e., equally-spaced x, 60° and 120° hatch. The resulting hatch vectors form equilateral triangles: accordingly, there will be regions where there is one, or three vectors overlap, but never two vectors in an overlapping relationship. The corresponding skin fill will be in the X, 60°, and 120° directions. These fill vectors will again not be allowed to produce additional exposure within the ½ the ECW of either side of their parallel hatch vectors. The order of curing will again be boundaries first then hatch and then fill. The boundaries will be given a full exposure to bring them to the desired cure depth. The hatch and fill vectors will again be shortened on each end by ½ the ECW of the boundary vectors. The hatch vectors will each be given ⅓ the required exposure necessary to achieve the final desired cure depth. The fill vectors will also be given ⅓ of this exposure.

Except in regions of boundary vectors, to reach full exposure, each point must be scanned by three vector types of ⅓ exposure from each type. In the region of skin alone, if all three skin types of equal (⅓) and overlapping exposure are used, a net exposure of 1 will be attained. Similarly, for a region of hatch and skin, one hatch type is used, along with the two skin types not parallel to it. Each is given an equal exposure of ⅓ to obtain a region of net exposure 1. If the hatch vectors form equilateral triangles, it follows that each time any two hatch vectors overlap, the third hatch vector will also be present. If each hatch vector is given an exposure of ⅓, then the net exposure in this region will be 1.

In regions where boundaries occur, an imbalanced situation exists due to the presence of a boundary vector as well as the other vector types described above. The possibilities include the presence of: 1 boundary + 3 hatch vectors; 1 boundary + 1 hatch + 2 fill vectors; or 1 boundary + 3 skin vectors. These combinations can be addressed, for example, in one of two ways: 1) have all hatch and fill vectors stop short of the boundary (at ½ the effective cure width) and then give the boundary itself an exposure of one; or 2) select two of the hatch types and the same two skin types to cure completely up to the boundary and stop the other hatch and skin type short of the boundary at ½ the ECW of the boundary. If the boundary vectors are given the ⅓ cure, as are the other vectors, this combination results in a net exposure of 1 in the boundary region. The first of the above two options is presently the most preferred.

Yet another embodiment is based on the use of x and y hatch along with the second option described above. In this case, the exposure in the boundary region would be due to the boundary vectors, one hatch and its corresponding fill type with the other hatch and fill type stopping short. This embodiment has the advantage of insuring better adhesion between the boundary vectors and the fill and hatch vectors.

Still another embodiment is based on the use of x and 60/120 hatch along with the net exposure in the boundary areas being made up of exposing boundary vectors along with exposing two of the three types of hatch and the corresponding fill vectors.

Other additional embodiments are conceivable. It is also possible to extend this approach to include other sources of print through, such as that due to cross hatch from the layer above the one that contains the down-facing feature. The cross hatch on this higher layer can actually print through the lower layer. Using a particular material, this print through effect is reduced when larger layer thicknesses are used and increased when smaller layer thicknesses are used. Using experimental or analytical methods, the amount of print through can be determined, and the cross hatch on the layer containing the down-facing feature can be given a correspondingly lower cure. After the exposure of this layer and the following layer, the down-facing feature will have a uniform cure. In most cases, there are cross hatch vectors on the layer immediately following the down-facing feature where the above compensation method would be useful. However, on rare occasions, an up-facing feature may be on the same layer as a down-facing feature (the feature is only one layer in thickness), requiring the hatch and fill to be perfectly matched based on the one layer thickness of cure. On layers that have both up- and down- facing features in the same area, it is important to insure that only the down-facing skin is cured, so as not to use more exposure than desired.

In the above description, only one effective cure width has been exemplified to describe the proximity with which vectors can approach one another, but more than one ECW can be used in appropriate circumstances.

The methods described herein can be verified experimentally using x- and y- hatch and fill without need of modified software. An object can be sliced using x- and y- hatch and x- and y- skin fill. The SLI file created can then be edited by hand, removing the skin fill vectors that are within a specific distance of their parallel hatch vectors. This SLI file can then be merged with a support file. The range file can then be prepared giving an equal cure to the x- and y- hatch, and an appropriate single line exposure given to the fill vectors in order to produce an equivalent total cure as that of the x and y hatch.

Alternatively, the software can be modified:
1) by creating a skin type corresponding to 60° cross hatch and another corresponding to 120° cross hatch,
2) by creating a slice option (or in some other appropriate program) to allow an offset for skin vectors to not be produced (or not drawn) in the vicinity of hatch paths, and
3) creating an option to allow reduction of cross hatch and fill vectors on each end by a desired amount.

Preferred Methods of Selecting and Determining Cure Depth

To make a theoretical determination of skin thickness, by one or more methods of calculation, one would ordinarily consider the parameters of step period (SP), step size (SS), laser power, beam profile, material, working curve thickness, working curve width, and offset. However, if a skin is formed that is several times wider than the laser beam, and a step size and an offset are used that are several times smaller than the laser beam width, the energy distribution over the skinned area will be substantially uniformly distributed. If the energy is uniformly distributed, the area will be uniformly cured to a particular depth depending on the exposure. Thus, the exposure is defined as, *Energy per unit area = Laser Power × Step Period/(Step Size × Offset)*. This above relationship can be equated to a particular thickness by plotting thickness versus log of exposure to obtain a linear relationship, and determining the slope and intercept of this plot. Since the above relationship does not explicitly contain focus, profile, and machine working curve parameters, the constants determined for one machine should be directly usable on another machine as long as the parameters of material, wavelength, and distance from scanning mirrors to surface of resin are the same (or accounted for).

The foregoing detailed description and following Examples should be understood as being illustrative rather than limiting, as routine variations and modifications are within the scope of the invention as will be appreciated by one of ordinary skill in the art. Accordingly, it is intended that the invention be limited only by the appended claims, and all equivalents thereof.

EXAMPLES

Example I

An experiment was conducted to determine whether skinning every layer of a part gives any advantage with regard to minimizing distortion as compared to previous building techniques.

Eight parts were built, in groups of two. Each group included a front and a rear object, which were identical except for their locations. Slicing and merging options were used to create the four different groups:

Skntin01—Front object has skin on every layer. Rear object has skin only on top and bottom.

Skntin02—Front object has skin only on top and bottom. Rear object has skin on every layer.

Skntin03—Front object has skin on every layer. Rear object has skin on every layer.

Skntin04—Front object has skin only on top and bottom. Rear object has skin only on top and bottom.

All groups were built with the following parameters:
Layer thickness—20 mils
Cure thickness for layer boundaries—26 mils
Hatch vectors ran parallel to the x-axis and the y-axis spaced at 50 mils.
Cure thickness for skin fill was not specified as thickness but as ½ the step period (SP) for a 26 mil cure and step size (SS) of 16. All skin fill vectors ran parallel to the x-axis with a 2 mil offset between them. (As a side note, measurement of skin thickness under similar cure indicated that thickness is approximately 20 mils.)

The results are summarized as follows:

| | | |
|---|---|---|
| Skntin01 | All skinned | distortion of wall perpendicular to direction of skinning = 3.6 mils |
| | | distortion of wall parallel to direction of skinning = 9.4 mils |
| | Normal | distortion of wall perpendicular to direction of skinning = 9.6 |
| | | distortion of wall parallel to direction of skinning = 9.7 |
| Skntin02 | All skinned | distortion of wall perpendicular to direction of skinning = 1.2 mils |
| | | distortion of wall parallel to direction of skinning = 8.2 mils |
| | Normal | distortion of wall perpendicular to direction of skinning = 9.1 mils |
| | | distortion of wall parallel to direction of skinning = 7.0 mils |
| Skntin03 | All skinned | distortion of wall perpendicular to direction of skinning = 1.5 mils |
| | | distortion of wall parallel to direction of skinning = 7.9 mils |
| | All skinned | distortion of wall perpendicular to direction of skinning = 2.0 mils |
| | | distortion of wall parallel to direction of skinning = 7.7 mils |
| Skntin04 | Normal | distortion of wall perpendicular to direction of skinning = 11.0 mils |
| | | distortion of wall parallel to direction of skinning = 9.7 mils |
| | Normal | distortion of wall perpendicular to direction of skinning = 9.5 mils |
| | | distortion of wall parallel to direction of skinning = 7.9 mils |

In summary, skinning each layer in the x-direction reduced distortion in dimensions measured parallel, but not perpendicular, to the x-axis.

EXAMPLE II

In a second experiment, parts were built by skinning each layer with skin that was perpendicular to the direction or the skin on the previous layer.

| Part GB349 | Front | Perpendicular skin | Distortion of wall perpendicular to direction of skinning = 4.9 mils; Distortion of wall parallel to direction of skinning = 4.4 mils |
| --- | --- | --- | --- |
| | Rear | Normal skin | Distortion of wall perpendicular to direction of skinning = 4.0 mils; Distortion of wall parallel to direction of skinning = 5.3 mils |
| Part GB350 | Front | Normal skin | Distortion of wall perpendicular to direction of skinning = 3.1 mils; Distortion of wall parallel to direction of skinning = 7.4 mils |
| | Rear | Perpendicular skin | Distortion of wall perpendicular to direction of skinning = 5.0 mils; Distortion of wall parallel to direction of skinning = (−2.7) mils |
| Part GB351 | Front | Normal skin | Distortion of wall perpendicular to direction of skinning = 5.3 mils; Distortion of wall parallel to direction of skinning = 6.2 mils |
| | Rear | Normal skin | Distortion of wall perpendicular to direction of skinning = 9.4 mils; Distortion of wall parallel to direction of skinning = 6.8 mils |
| Part GB352 | Front | Perpendicular skin | Distortion of wall perpendicular to direction of skinning = 2.5 mils; Distortion of wall parallel to direction of skinning = 3.0 mils |
| | Rear | Perpendicular skin | Distortion of wall perpendicular to direction of skinning = 1.9 mils; Distortion of wall parallel to direction of skinning = 4.1 mils |
| Part GB354 | Front | Skin parallel to y | Distortion of wall perpendicular to direction of skinning = 6.0 mils; Distortion of wall parallel to direction of skinning = 1.0 mils |
| | Rear | Skin parallel to x | Distortion of wall perpendicular to direction of skinning = 1.5 mils; Distortion of wall parallel to direction of skinning = 7.5 mils |

In summary, skinning in x- and y- directions on opposite layers appears to generally reduce distortion to some extent in each direction.

EXAMPLE III

Similar experiments to those set forth in Examples I and II tended to show that providing x- and y- skin fill on each layer generally reduced distortion in both x- and y- directions.

EXAMPLE IV

Four 1"×1" squares were built in a single build process on a stereolithographic apparatus. Each square consisted of six 20 mil layers. The structural support for each layer was based on x- and y- cross hatch, spaced at a 50 mil separation. Each square was supported by a grid of webs placed at a spacing of ¼". The webs consisted of ten 20 mil layers. On the top surface of each square a standard skinning technique was applied. Therefore, the top surface was given x skin fill spaced at 2 mils on top of a grid of x- and y- cross hatch. The supporting web structures were numbered 1 through 4 while the square patches were numbered 5 through 8 (based on the merge order).

On the first layer of each square, x- and y- hatch were applied using a particular exposure along with a particular skinning technique and associated exposure. The second through sixth layers were given the standard 26 mil cure depth for boundaries and hatch. On the first layer the boundary vectors were given the full desired cure depth, without factoring in any reduction in hatch and skin vectors for the purpose of minimizing multiple exposures in boundary regions. The skinning/exposure technique was varied for the first layer of each patch.

Square Patch 5: "Standard Approach to Down-Facing Skins"
  boundary=26 mil cure (SP 65, SS 2)
  x- and y- cross hatch=26 mil cure (SP 65, SS 2)
  x- skin fill=half the SP of a 26 mil cure if SS=2 (SP 33, SS 16); fill vectors spaced at 2 mils with no gaps except exact duplicates of hatch.
  y- skin fill=None Square Patch 6: "Down-Facing Skins with Skin Slightly Under-Exposed"
  x- and y- cross hatch=20 mil cure (SP 29, SS 2)
  boundary=20 mil cure (SP 29, SS 2)
  x- skin fill=SP for a 16 mil cure if SS=2 (SP 17, SS 16); fill vectors spaced at 2 mils with vectors removed that are 2 mils and 4 mils from parallel hatch vectors (this means the skin fill vectors that are closest to the hatch are 6 mils away).
  y- skin fill=SP for a 16 mil cure if SS=2 (SP 17, SS 16); fill vectors spaced at 2 mils with vectors removed that are 2 mils and 4 mils from parallel hatch vectors.

Square Patch 7: "Down-Facing Skins with Skin Exposure Closely Matched to Cross Hatch Exposure"
  boundary=20 mil cure (SP 29, SS 2)
  x- and y- cross hatch=20 mil cure (SP 29, SS 2)
  x- skin fill=SP for a 20 mil cure if SS=2 (SP 29, SS 16); fill vectors spaced at 2 mils with vectors removed that are 2 mils and 4 mils from parallel hatch vectors.
  y- skin fill=SP for a 20 mil cure if SS=2 (SP 29, SS 16); fill vectors spaced at 2 mils with vectors removed that are 2 mils and 4 mils from parallel hatch vectors.

Square Patch 8: "Down-Facing Skins with the Skin Slightly Over-Exposed"
  boundary=20 mil cure (SP 29, SS 2)
  x- and y- cross hatch=20 mil cure (SP 29, SS 2)
  x- skin fill=SP for a 26 mil cure if SS=2 (SP 65, SS 16); fill vectors spaced at 2 mils with vectors removed that are 2 and 4 mils from parallel hatch vectors.
  y- skin fill=SP for a 26 mil cure if SS=2 (SP 65, SS 16); fill vectors spaced at 2 mils with vectors removed that are 2 and 4 mils from parallel hatch vectors.

Figure 6:
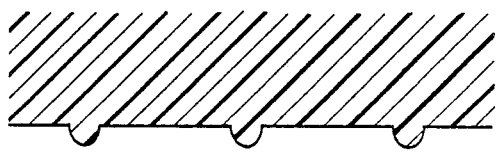
FIG. 6 collectively shows down-facing surface profiles of parts made in accordance with Example IV, below.
Figure 6:
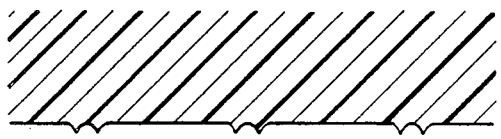
Figure 6:
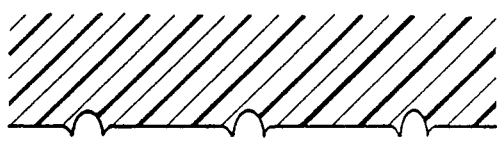

After building these four square patches they were examined, and none of the parts showed any signs of distortion. Part 5 had the typical large waffle with cross hatch protruding beyond the skin. Part 6 had a smaller waffle with cross hatch protruding beyond the skin. Part 7 had cross hatch and skin fill cured down to approximately the same level; however, there were slight protrusions along the sides of the cross hatch and a slight depression in the center of the cross hatch indicating that the skin was slightly overcured and maybe that the skin was not cured within the proper effective cure width of the cross hatch. Part 8 seemed to have cross hatch whose center line is depressed as compared to the skin and to a raised overlapping edge where skin and cross hatch joined. The size of the discontinuities in Part 8 were larger than those in Part 7. See FIG. 6 for a sketch of each of these cases.

A scratch test indicates that Part 7 was almost smooth, Part 8 was slightly rougher, Part 6 was much rougher, and finally Part 5 was the roughest of all. A visual inspection indicated that Part 7 looked best, followed by Part 8 or 6, then finally by Part 5.

The results of this experiment showed that the technique disclosed herein reduced waffle considerably. With the parameters used in this test, hatch strength appeared to be sufficient to support the skin without distortion.

I claim:

1. A stereolithographic method of constructing an object by forming stacked layers of a medium solidified by exposure to synergistic stimulation applied in a pattern, comprising the steps of:
   exposing a portion of a layer to synergistic stimulation comprising a first set of nonconsecutive parallel skin lines; and
   exposing the portion to a second set of nonconsecutive parallel skin lines substantially interposed between and parallel to the first set of nonconductive parallel lines.

2. The method of claim 1 wherein adjacent lines of the first set are sufficiently spaced apart to prevent lines of solidified medium of the first set from adhering to each other.

3. The method of claim 2 further comprising the step of reducing any curl by using a technique selected from the group consisting of smalleys, rivets, webs, multipass and the combination thereof.

4. The method of claim 1 wherein the medium comprises a powder.

5. The method of claim 1 wherein the medium comprises a photopolymer.

6. A stereolithographic method of constructing an object by forming stacked layers of a medium solidified by exposure to synergistic stimulation applied in a pattern, comprising the steps of:
   solidifying a first skin on at least a first portion of a first layer by selectively exposing medium to synergistic stimulation comprising a first set of parallel skin lines;
   solidifying a second skin on at least a second portion of a second layer by selectively exposing medium to synergistic stimulation comprising at least a second set of parallel skin lines which are not parallel to the skin lines of the first set.

7. The method of claim 6 wherein the medium comprises a photopolymer.

8. The method of claim 6 further comprising the step of reducing any curl by using a technique selected from the group consisting of smalleys, rivets, webs, multipass and the combination thereof.

9. A method for reducing non-uniform cure depths of a portion of a layer of an object made by stereolithography, comprising the steps of:
   exposing a portion of the layer to synergistic stimulation in a grid pattern of hatch lines extending in a first direction and in a second direction;
   exposing the portion of the layer to synergistic stimulation comprising the first set of skin lines extending in the first direction, the first set of skin lines overlapping the hatch lines extending in the second direction but not overlapping the hatch lines extending in the first direction;
   exposing the portion of the layer to synergistic stimulation comprising a second set of skin lines extending in a second direction, the second set of skin lines overlapping the hatch lines extending in the first direction but not overlapping the hatch lines extending in the second direction.

10. A method for reducing irregularities in cure depth of a region of a layer of an object made by stereolithography by exposing a building material to synergistic stimulation to at least partially solidify the material, comprising the steps of:
    exposing first area elements of the region to synergistic stimulation comprising at least a first set of lines spaced apart from each other so that no direct adhesion occurs between material at least partially solidified by the at least first set;
    exposing second area elements of the region to synergistic stimulation comprising at least a second set of lines, with the lines of the at least second set adhered to each other and to the lines of the at least first set and with the at least second set of lines exposing substantially all area elements of the region not at least partially solidified by the at least first set, such that the combined exposure of the at least first set and the at least second sets of lines results in substantially the same exposure to the first area elements and the second area elements.

11. The method of claim 10 wherein the lines in each set of the at least first set are parallel to each other.

12. The method of claim 11 wherein corresponding to each set of the at least first set is a set of the at least second set which has lines running parallel to a corresponding individual set of the at least first set.

13. The method of claim 12 wherein corresponding individual sets of the at least first set and at least second set do not overlap each other.

14. The method of claim 10 wherein the medium is a photopolymer.

15. A method for reducing irregularities in cure depth of a region of a layer of an object made by stereolithography, comprising the steps of:
    at least partially solidifying a first portion of a region of a layer by exposing the first portion to synergistic stimulation comprising a first set of lines spaced apart from each other so that no direct adhesion occurs between the lines;
    at least partially solidifying a second portion of the region of the layer, which at least substantially includes all area elements not at least partially solidified in association with the first set, by exposing the second portion to synergistic stimulation comprising a second set of lines, wherein the exposure of the second set when combined with the exposure of the first set results in substantially all area elements being given similar exposures, wherein the lines of the second set are adhered to each other and to the lines of the first set.

16. The method of claim 15 wherein the medium is a photopolymer.

17. A method for reducing irregularities in cure depth of a region of a layer of an object made by stereolithography, comprising the steps of:
   at least partially solidifying a first portion of a region of a layer by exposing the first portion to synergistic stimulation comprising a first set of lines spaced apart from each other so that no direct adhesion occurs between the lines,
   at least partially solidifying a second portion of the region of the layer by exposing the second portion to synergistic stimulation comprising a second set of lines spaced apart from each other so that no direct adhesion occurs between the lines of the second set, and with the second set of lines overlapping the first set of lines at intersection area elements which being exposed by both the lines of the first set and the lines of the second set, receive an increased exposure;
   at least partially solidifying a third portion of the region of the layer, which at least substantially includes all area elements not receiving the increased exposure resulting from the combined exposures of the first and second sets, by exposing the third portion to synergistic stimulation comprising at least a third set of lines, wherein the combined exposure of the first, second, and at least third sets results in substantially all area elements of the entire region receiving substantially equivalent exposures, wherein the lines of the at least third set are adhered to each other and to the lines of the first and second sets.

18. The method of claim 17 wherein the medium is a photopolymer.

19. A method for reducing irregularities in cure depth of a region of a layer of an object made by stereolithography, comprising the steps of:
   at least partially solidifying a first portion of a region of a layer by exposing the first portion to synergistic stimulation comprising a first set of lines spaced apart from each other so that no direct adhesion occurs between the lines;
   at least partially solidifying a second portion of the region of the layer by exposing the second portion to synergistic stimulation comprising a second set of lines spaced apart from each other so that no direct adhesion occurs between the lines of the second set;
   at least partially solidifying a third portion of the region of the layer by exposing the third portion to synergistic stimulation comprising a third set of lines spaced apart from each other so that no direct adhesion occurs between the lines of the third set, and wherein at least some individual area elements, exposed by the lines of the first set, the lines of the second set, and the lines of the third set, receive a maximum exposure where they overlap;
   at least partially solidifying a fourth portion of the region of the layer, which at least substantially includes all area elements not receiving the maximum exposure resulting from the combined exposures of the first, second, and third sets, by exposing the fourth portion to synergistic stimulation comprising at least a fourth set of lines, wherein the combined exposure of the first, second, third, and at least fourth sets results in substantially all area elements being given similar exposures, wherein the lines of the fourth set are adhered to each other and to the lines of the first, second, and third sets.

20. The method of claim 19 wherein the medium is a photopolymer.

21. A method for reducing irregularities in cure depth of a region of a layer of an object made by stereolithography, comprising the steps of:
   at least partially solidifying a first portion of a region of a layer by exposing the first portion to synergistic stimulation comprising a first set of lines spaced apart from each other so that no direct adhesion occurs between the lines,
   at least partially solidifying a second portion of the region of the layer by exposing the second portion to synergistic stimulation comprising a second set of lines spaced apart from each other so that no direct adhesion occurs between the lines of the second set, and wherein at least a portion of the lines of the first set and a portion of the lines of the second set adhere to each other, and wherein the lines of the first set do not overlap the lines of the second set, wherein at least some individual area elements exposed by the lines of at least one of the sets receive a maximum exposure;
   at least partially solidifying a third portion of the region of the layer, which at least substantially includes all area elements not receiving the maximum exposure resulting from the exposures of the first and second sets, by exposing the third portion to synergistic stimulation comprising at least a third set of lines, wherein the combined exposure of the first, second, and the at least third sets results in substantially all area elements being given similar exposures, wherein the lines of the at least third set are adhered to each other and to the lines of the first and second sets.

22. A method for reducing irregularities in cure depth of a region of a layer of an object made by stereolithography, comprising the steps of:
   at least partially solidifying a first portion of down-facing a region of a layer by exposing the first portion to synergistic stimulation comprising a first set of lines;
   at least partially solidifying a second portion of the down-facing region of the layer, which at least substantially includes all area elements of the first portion not at least partially solidified in association with the first set, by exposing the second portion to synergistic stimulation comprising at least a second set of lines intersecting the first set of lines at intersection points, the exposure of the at least second set of lines is reduced at the intersection points, such that the exposure of the at least second set when combined with the exposure of the first set results in substantially all area elements being given similar exposures.

23. A method for determining a solidification depth of at least a portion of a skin of a three-dimensional object being formed by stereolithography from a medium solidified by exposure of a set of spaced skin lines to a beam of synergistic stimulation having a power and a scanning velocity, comprising the steps of:

a) determining the power of the beam of synergistic stimulation;
b) determining the spacing between the skin lines;
c) determining the scanning velocity of the beam;
d) calculating the exposure the beam provides based on the power of the beam, the spacing between the skin lines and the scanning velocity of the beam;
e) specifying medium parameters of the medium relating solidification depth to exposure; and
f) determining the solidification depth from the calculated exposure and the relationship between solidification depth and exposure.

24. The method of claim 23 wherein the medium is a photopolymer.

25. The method of claim 24 wherein the medium parameters are contained in a graph of exposure versus solidification depth for the medium.

26. A method for selecting exposure parameters to provide a desired skin depth of a skin formed from a set of spaced skin lines on a layer of an object made by stereolithographically by forming stacked layers of a medium solidified by exposure to a beam of synergistic stimulation having a scanning velocity, comprising the steps of:
a) selecting the desired skin depth;
b) specifying medium parameters of the medium relating solidification depth to exposure;
c) determining the exposure required to obtain the desired skin depth by using the material parameters of the medium which relate skin depth to exposure;
d) specifying two of beam power, skin line spacing and scanning velocity;
e) calculating the remaining unspecified parameter of step d) using the determined exposure and the two parameters specified in step d).

27. The method of claim 26 wherein the medium is a photopolymer.

28. A method for determining material parameters of a material having a penetration depth and a critical exposure corresponding to specific synergistic stimulation, which parameters are parameters necessary for predicting cure depth of a skin on a layer of an object made stereolithographically, comprising the steps of:
forming a first skin on a first area of a layer by exposing the first area to a beam of synergistic stimulation having a beam power in a pattern of first skin vectors having a first offset traced at a first velocity, providing a first amount of exposure;
forming at least a second skin on at least a second area of a layer by exposing the at least second area to the laser in a pattern of at least second skin vectors having at least a second offset traced at at least a second velocity, providing at least a second amount of exposure different from the first amount of exposure;
measuring the thickness of the first skin and the at least second skin;
determining the first and at least second amounts of exposures according to the relationship of $exposure = beam\ power \div (offset \times velocity)$;
fitting the measured thicknesses versus logarithm of exposures for the first and at least second skins to a linear relationship; and
determining the slope of the linear relationship which is the penetration depth and determining the X-intercept of the linear relationship which is the critical exposure.

29. The method of claim 28 wherein the beam of synergistic stimulation is a laser beam.

30. The method of claim 28 wherein the linear relationship is determined by plotting.

31. The method of claim 28 wherein at least one of the patterns of the first and at least second skin vectors comprises non-consecutive skin vectors.

32. The method of claim 28 wherein the first and at least second set of skin vectors comprise two sets of skin vectors.

33. The method of claim 28 wherein the material is a photopolymer.

34. A stereolithographic method of constructing an object having internal and external regions, by forming stacked layers of a medium solidified by exposure to synergistic stimulation applied in a pattern, comprising the steps of:
exposing substantially all external regions of the object to synergistic stimulation to provide skin fill on the external regions;
specifying internal regions of the object to be selected and unselected portions wherein there is at least a selected portion and there is at least an unselected portion;
exposing the selected portion of the internal regions to synergistic stimulation to provide skin fill on the selected portions of the internal regions; and
exposing the unselected portion to synergistic stimulation in a hatch pattern.

35. A stereolithographic method of constructing an object by forming stacked layers of a medium solidified by exposure to synergistic stimulation applied in a pattern, comprising the steps of:
identifying any up-facing regions, down-facing regions, and internal regions of a first layer;
identifying any internal regions of a second layer;
exposing any down-facing region of the first layer to synergistic stimulation to solidify substantially all area elements of the down-facing region;
exposing any up-facing region of the first layer to synergistic stimulation to solidify substantially all area elements of the up-facing region;
exposing at least a first portion of any internal region of the first layer to synergistic stimulation to solidify substantially all area elements within the first portion wherein the first portion has a width substantially greater than a cure width of lines of a hatch pattern; and
exposing a second portion of any internal region of a second layer to synergistic stimulation in lines of a hatch pattern.

36. The method of claim 35 wherein the exposing of the first portion is performed according to a set of parallel skin vectors.

37. The method of claim 35 further comprising the step of hatching the first portion of any internal region of the first layer.

38. The method of claim 37 further comprising the step of hatching the first portion with lines of an X/60/120 degree hatch pattern.

39. The method of claim 35 further comprising the step of hatching all regions of each layer of the object.

40. The method of claim 35 wherein the medium comprises a photopolymer.

41. The method of claim 40 wherein the synergistic stimulation comprises UV light.

42. The method of claim 40 wherein all area elements of down-facing region are provided with a equivalent exposures.

43. The method of claim 40 further comprising the step of reducing any curl by using a technique selected from the group consisting of smalleys, rivets, webs, multipass and the combination thereof.

44. The method of claim 35 wherein the layers are periodic.

45. A stereolithographic method of constructing an object by forming stacked layers of a medium solidified by exposure to synergistic stimulation applied in a pattern, comprising the steps of:
  forming a skin on at least a portion of a layer by exposing the medium to synergistic stimulation comprising a first set of parallel skin lines;
  further solidifying the portion by exposing it to synergistic stimulation comprising a second set of parallel skin lines, said lines in said second set being non-parallel to said lines in said first set.

46. The method of claim 45 wherein the lines of the first set and second set are perpendicular to each other.

47. The method of claim 45 wherein the skin lines of at least one of the first set and second set are non-overlapping.

48. The method of claim 45 wherein the skin lines of at least one of the first set and second set are overlapping.

49. The method of claim 45 further comprising the step of hatching the layer prior to exposing the first and second sets of skin lines.

50. The method of claim 49 wherein the hatching comprises a first set of parallel hatch lines and a second set of parallel hatch lines, with the lines of the second set of hatch lines not parallel to the lines of the first set of hatch lines, and the first set of hatch lines runs parallel to the first set of skin lines, and the second set of hatch lines runs parallel to the second set of skin lines.

51. The method of claim 50 wherein the hatch lines of the first set are perpendicular to the hatch lines of the second set.

52. The method of claim 45 wherein the medium comprises a photopolymer.

53. The method of claim 45 further comprising the step of reducing any curl by using a technique selected from the group consisting of smalleys, rivets, webs, multipass and the combination thereof.

54. The method of claim 45 further comprising the step of further solidifying the portion by exposing it to synergistic stimulation comprising at least a third set of parallel skin lines, said lines in said at least third set being non-parallel to said lines in the first and second sets.

* * * * *